(12) United States Patent
Chen et al.

(10) Patent No.: US 10,141,919 B2
(45) Date of Patent: Nov. 27, 2018

(54) RESOLUTION-ENHANCING CMOS ALL-DIGITAL PULSE-MIXING METHOD AND DEVICE THEREOF

(71) Applicant: National Kaohsiung First University of Science and Technology, Kaohsiung (TW)

(72) Inventors: Chun-Chi Chen, Kaohsiung (TW); Che-Hsun Chu, Kaohsiung (TW); Chorng-Sii Hwang, Kaohsiung (TW)

(73) Assignee: National Kaohsiung First University of Science and Technology, Kaohsiung (TW)

( * ) Notice: Subject to any disclaimer, the term of this patent is extended or adjusted under 35 U.S.C. 154(b) by 6 days.

(21) Appl. No.: 15/593,381

(22) Filed: May 12, 2017

(65) Prior Publication Data

US 2017/0250683 A1     Aug. 31, 2017

Related U.S. Application Data

(63) Continuation-in-part of application No. 14/754,792, filed on Jun. 30, 2015, now Pat. No. 9,685,937.

(30) Foreign Application Priority Data

Jul. 10, 2014   (TW) ............................. 103123805 A
Jul. 10, 2014   (TW) ............................. 103123807 A

(51) Int. Cl.
  *H03H 11/26*   (2006.01)
  *H03K 5/12*   (2006.01)
  *H03K 19/20*   (2006.01)
  *H03K 5/134*   (2014.01)
  *H03K 5/00*   (2006.01)

(52) U.S. Cl.
  CPC ............... *H03K 5/12* (2013.01); *H03K 5/134* (2014.07); *H03K 19/20* (2013.01); *H03K 2005/00195* (2013.01)

(58) Field of Classification Search
  CPC ............ H03K 19/01721; A61B 5/0004; A61B 5/04001; A61B 5/05
  See application file for complete search history.

(56) References Cited

U.S. PATENT DOCUMENTS

| | | |
|---|---|---|
| 6,288,587 B1 * | 9/2001 | Chen ................... G04F 10/00 327/261 |
| 2006/0132340 A1 * | 6/2006 | Lin ..................... G04F 10/005 341/120 |

* cited by examiner

*Primary Examiner* — Sibin Chen
(74) *Attorney, Agent, or Firm* — Alan D. Kamrath; Kamrath IP Lawfirm, P.A.

(57) ABSTRACT

A CMOS all-digital pulse-mixing device includes a plurality of homogeneous logic elements serially connected to form a basic element sequence, an odd-positioned element parallel connection set and an even-positioned element parallel connection set. The basic element sequence includes odd combination positions and even combination positions. The odd-positioned element parallel connection set serially connects with one of the odd combination positions and the even-positioned element parallel connection set serially connects with one of the even combination positions. The odd-positioned element parallel connection set and the even-positioned element parallel connection set are provided to stretch or shrink a pulse mixture, which is distinguished from a conventional full-customized pulse-mixing device.

20 Claims, 6 Drawing Sheets

RESOLUTION-ENHANCING CMOS ALL-DIGITAL PULSE-MIXING METHOD AND DEVICE THEREOF

CROSS REFERENCE TO RELATED APPLICATIONS

This application is a continuation-in-part of U.S. patent application Ser. No. 14/754,792, filed Jun. 30, 2015, which is hereby incorporated by reference in its entirety.

BACKGROUND OF THE INVENTION

1. Field of the Invention

The present invention relates to a resolution-enhancing CMOS all-digital pulse-mixing method and device thereof suitable for a low-level semiconductor manufacturing process. Particularly, the present invention relates to the double-stage or multi-stage resolution-enhancing CMOS all-digital pulse-mixing method and device thereof.

2. Description of the Related Art

By way of example, U.S. Pat. No. 6,288,587, entitled "CMOS Pulse Shrinking Delay Element with Deep Subnanosecond Resolution," discloses a CMOS pulse shrinking delay element with deep subnanosecond resolution applicable to a Time-to-Digital Converter (TDC). The CMOS pulse shrinking delay element includes at least three internal adjacent elements and can control its pulse shrinking or expanding capability by adjusting the size ratio or driving capabilities between two of the internal adjacent elements.

Accordingly, the above CMOS pulse shrinking delay element can avoid adjusting an external bias voltage or continuously calibrate the conventional CMOS pulse shrinking delay element in order to control pulse shrinking or expanding capabilities, to facilitate simplification of circuits using the delay element, to permit more precise design and control of the pulse shrinking or expanding capabilities of every element in a TDC circuit, and in practice to reduce single shot errors in a cyclic TDC utilizing the pulse shrinking delay element to on the order of ten picoseconds, resulting in a TDC having extremely fine resolution, excellent accuracy, low power consumption, and low sensitivity to supply voltage and ambient temperature variations.

Moreover, the above CMOS pulse shrinking delay element is designed to form a full-customized pulse-shrinking device which is not a CMOS multi-stage pulse-shrinking or pulse-stretching device but an ordinary CMOS single-stage full-customized pulse-shrinking device.

However, there is a need of improving the conventional CMOS pulse-shrinking, pulse-stretching or shrink-and-stretch mixing method and device thereof for modifying the circuit structure and enhancing the functions (e.g. resolution problem). The above-mentioned patent is incorporated herein by reference for purposes including, but not limited to, indicating the background of the present invention and illustrating the situation of the art.

As is described in greater detail below, the present invention provides a CMOS all-digital pulse-mixing method and device thereof for enhancing resolution with simplifying a semiconductor-designing process and reducing a semiconductor-designing time. A plurality of homogeneous logic elements, a first element parallel connection set and a second element parallel connection set are combined to form a CMOS all-digital pulse-mixing device. The first element parallel connection set and the second element parallel connection set are an odd-positioned element parallel connection set and an even-positioned element parallel connection set. The first element parallel connection set and the second element parallel connection set are applied to stretch (or shrink) pulse signals for enhancing resolution of the device in such a way as to mitigate and overcome the above problem.

SUMMARY OF THE INVENTION

The primary objective of this invention is to provide a CMOS all-digital pulse-mixing method and device thereof. A plurality of homogeneous logic elements, a first element parallel connection set and a second element parallel connection set are combined to form a CMOS all-digital pulse-mixing device. The first element parallel connection set and the second element parallel connection set are an odd-positioned element parallel connection set and an even-positioned element parallel connection set. The first element parallel connection set and the second element parallel connection set are applied to stretch (or shrink) pulse signals. Advantageously, the CMOS all-digital pulse-mixing method and device is successful in enhancing resolution, simplifying a semiconductor-designing process and reducing a semiconductor-designing time.

The CMOS all-digital pulse-mixing method in accordance with an aspect of the present invention includes:

providing a plurality of odd combination positions and a plurality of even combination positions on a basic element sequence which is formed from a series of basic elements;

providing a plurality of homogeneous logic elements, at least one first element parallel connection set and at least one second element parallel connection set for forming an all-digital pulse-mixing device;

arranging the at least one first element parallel connection set as an odd-positioned element parallel connection set, with the at least one first element parallel connection set having a first parallel connection number of first logic elements;

arranging the at least one second element parallel connection set as an even-positioned element parallel connection set, with the at least one second element parallel connection set having a second parallel connection number of second logic elements;

serially connecting the at least one first element parallel connection set with a first predetermined position of the a plurality of odd combination positions and serially connecting the at least one second element parallel connection set with a second predetermined position of the a plurality of even combination positions; and utilizing the at least one first element parallel connection set and the at least one second element parallel connection set to stretch or shrink a pulse signal, with mixing a first degree of pulse stretching and a second degree of pulse shrinking to generate a stretched pulse signal or a shrunk pulse signal.

In a separate aspect of the present invention, the first parallel connection number of first logic elements and the second parallel connection number of second logic elements are different or identical.

In a further separate aspect of the present invention, the homogeneous logic element is a logic gate element, a NOT gate element, an AND gate element or other logic gate element.

In yet a further separate aspect of the present invention, the odd combination position of the basic element sequence includes a start combination position which is a third combination position.

In yet a further separate aspect of the present invention, the first logic elements and the second logic elements are homogeneous logic elements.

The CMOS all-digital pulse-mixing device in accordance with an aspect of the present invention includes:

a basic element sequence including a plurality of odd combination positions and a plurality of even combination positions;

a plurality of homogeneous logic elements connected to form the basic element sequence;

at least one first element parallel connection set formed as an odd-positioned element parallel connection set, with the at least one first element parallel connection set having a first parallel connection number of first logic elements, with serially connecting the at least one first element parallel connection set with a first predetermined position of the a plurality of odd combination positions; and at least one second element parallel connection set formed as an even-positioned element parallel connection set, with the at least one second element parallel connection set having a second parallel connection number of second logic elements, with serially connecting the at least one second element parallel connection set with a second predetermined position of the a plurality of even combination positions;

wherein the at least one first element parallel connection set and the at least one second element parallel connection set are utilized to stretch or shrink a pulse signal, with mixing a first degree of pulse stretching and a second degree of pulse shrinking to generate a stretched pulse signal or a shrunk pulse signal.

In a separate aspect of the present invention, the first parallel connection number of first logic elements and the second parallel connection number of second logic elements are different or identical.

In a further separate aspect of the present invention, the homogeneous logic element is selected from a logic gate element, a NOT gate element, an AND gate element or other logic gate element.

In yet a further separate aspect of the present invention, the odd combination position of the basic element sequence includes a start combination position which is a third combination position.

In yet a further separate aspect of the present invention, the first logic elements and the second logic elements are homogeneous logic elements.

In a further separate aspect of the present invention, the first element parallel connection set and the second element parallel connection set define a double-stage pulse-mixing device.

The CMOS all-digital pulse-mixing device in accordance with another aspect of the present invention includes:

a basic element sequence including a plurality of odd combination positions and a plurality of even combination positions;

a plurality of homogeneous logic elements connected to form the basic element sequence;

a first element parallel connection set formed as an odd-positioned element parallel connection set, with the first element parallel connection set having a first parallel connection number of first logic elements, with serially connecting the first element parallel connection set with a first predetermined position of the a plurality of odd combination positions;

a second element parallel connection set formed as an even-positioned element parallel connection set, with the second element parallel connection set having a second parallel connection number of second logic elements, with serially connecting the second element parallel connection set with a second predetermined position of the a plurality of even combination positions;

a third element parallel connection set formed as an odd-positioned element parallel connection set or an even-positioned element parallel connection set, with the third element parallel connection set having a third parallel connection number of third logic elements, with serially connecting the third element parallel connection set with a third predetermined position of the a plurality of odd combination positions and the a plurality of even combination positions; and a fourth element parallel connection set formed as an even-positioned element parallel connection set or an odd-positioned element parallel connection set, with the fourth element parallel connection set having a fourth parallel connection number of fourth logic elements, with serially connecting the fourth element parallel connection set with a fourth predetermined position of the a plurality of even combination positions and the a plurality of odd combination positions;

wherein the first element parallel connection set and the second element parallel connection set are utilized to stretch or shrink a pulse signal, with mixing a first degree of pulse stretching and a second degree of pulse shrinking to generate a first-stage stretched pulse signal or a first-stage shrunk pulse signal; and wherein the third element parallel connection set and the fourth element parallel connection set are further utilized to stretch or shrink the pulse signal, with mixing a third degree of pulse stretching or pulse shrinking and a fourth degree of pulse shrinking or pulse stretching to generate a second-stage stretched pulse signal or a second-stage shrunk pulse signal.

In a separate aspect of the present invention, the first parallel connection number of first logic elements and the second parallel connection number of second logic elements are different or identical and the third parallel connection number of third logic elements and the fourth parallel connection number of fourth logic elements are different or identical.

In a further separate aspect of the present invention, the first element parallel connection set, the second element parallel connection set, the third element parallel connection set and the fourth element parallel connection set define a four-stage pulse-mixing device or further expands to define a multi-stage pulse-mixing device.

In yet a further separate aspect of the present invention, the homogeneous logic element is a logic gate, a NOT gate element or an AND gate element.

In yet a further separate aspect of the present invention, the odd combination position of the basic element sequence includes a start combination position which is a third combination position.

In yet a further separate aspect of the present invention, the first logic elements, the second logic elements, the third logic elements and the fourth logic elements are homogeneous logic elements.

Further scope of the applicability of the present invention will become apparent from the detailed description given hereinafter. However, it should be understood that the detailed description and specific examples, while indicating preferred embodiments of the invention, are given by way of illustration only, since various will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

It is noted that a resolution-enhancing CMOS all-digital pulse-mixing method in accordance with the preferred embodiment of the present invention can be applicable to various automatic or semi-automatic pulse-shrinking or pulse-stretching methods, including systematic temperature measuring method, for example, which are not limitative of the present invention. A resolution-enhancing CMOS all-digital pulse-mixing device of the preferred embodiment of the present invention is suitable for various pulse-shrinking or pulse-stretching systems, including pulse-shrinking delay monitoring systems or timing measurement equipment, for example, which are not limitative of the present invention.

Throughout the specification, unless the context requires otherwise, the technical term "homogeneous logic elements" applied in the CMOS pulse-shrinking, pulse-stretching or shrink-and-stretch mixing method and device thereof has the meaning of same sizes (i.e. channel widths or lengths) of logic elements (e.g. NOT gate or other logic gate elements) as basic elements and the technical term "inhomogeneous logic element" used herein has relatively different sizes of logic elements (e.g. AND gate, NOT gate or other logic gate elements) with respect to the homogeneous logic elements.

Figure 1:
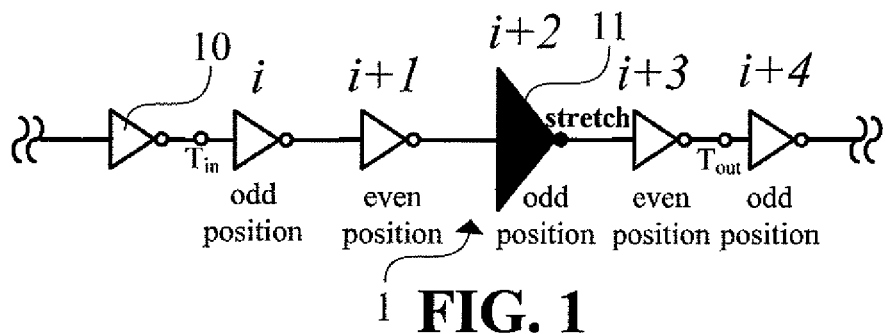
FIG. 1 is a structurally schematic view of a full-customized CMOS single-stage pulse-shrinking or pulse-stretching device in accordance with a preferred embodiment of the present invention.
Figure 1A:
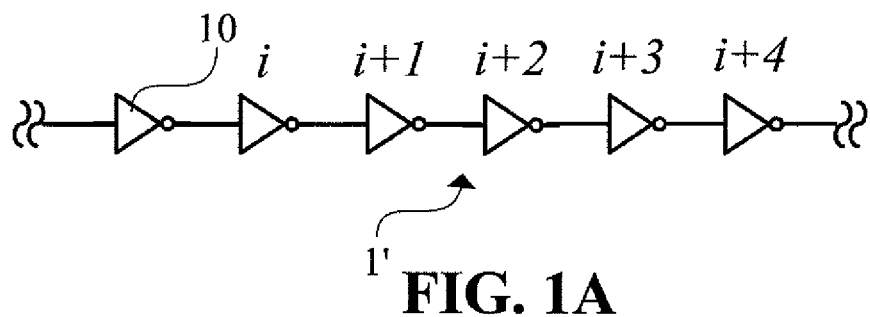
FIG. 1A is a structurally schematic view of a series of basic elements prior to forming the full-customized CMOS single-stage pulse-shrinking or pulse-stretching device in accordance with the preferred embodiment of the present invention.

FIG. 1 shows a structurally schematic view of a full-customized CMOS single-stage pulse-shrinking or pulse-stretching device in accordance with a preferred embodiment of the present invention and FIG. 1A shows a structurally schematic view of a series of basic elements prior to forming the full-customized CMOS pulse shrinking or stretching device, shown in FIG. 1, in accordance with the preferred embodiment of the present invention. Referring now to FIGS. 1 and 1A, prior to forming the full-customized CMOS pulse-stretching device 1 of the preferred embodiment of the present invention, a basic element sequence 1' is provided. Comparing with the full-customized CMOS pulse-stretching device 1, the basic element sequence 1' only includes a plurality of homogeneous logic elements 10, which is accordingly incapable of shrinking or stretching a pulse.

Referring back to FIG. 1, the full-customized CMOS pulse-stretching device 1 of the preferred embodiment of the present invention includes a plurality of homogeneous logic elements 10 and at least one odd-positioned inhomogeneous logic element 11 (located at relative odd position of the basic element sequence) serially connected to form a pulse-shrinking or pulse-stretching device. In the full-customized CMOS pulse-stretching device 1, a pulse $T_{in}$ is passed through the homogeneous logic elements 10 and the odd-positioned inhomogeneous logic element 11 in sequence for pulse stretching. After a predetermined delay time, an output pulse $T_{out}$ is output an end element of the homogeneous logic elements 10.

Referring again to FIGS. 1 and 1A, by way of example, the basic element sequence 1' includes a plurality of odd combination positions (i+2, i+4) and a plurality of even combination positions (i+1, i+3) which are alternatively arranged. The homogeneous logic elements 10 and the odd-positioned inhomogeneous logic element 11 are suitably arranged at the associated odd combination positions and the associated even combination positions for serial connection. The channel width or length of the odd-positioned inhomogeneous logic element 11 is selectively greater than those of the homogeneous logic elements 10 in design such that the smaller size of all homogeneous logic elements 10 can be selected for reducing the total area of the circuit. Advantageously, the CMOS pulse-shrinking or pulse-stretching method and device of the present invention is successful in minimizing dimensions or an area of a designed circuit and reducing the semiconductor-designing cost.

With continued reference to FIGS. 1 and 1A, the homogeneous logic elements 10 are selected from logic gate elements which are NOT gates or other logic elements (e.g.

AND gate elements). Each of the homogeneous logic elements 10 has a function of conducting pulses or the likes. However, a pulse cannot be effectively shrunk or stretched when passing through two adjacent elements of the homogeneous logic elements 10.

Figure 1B:
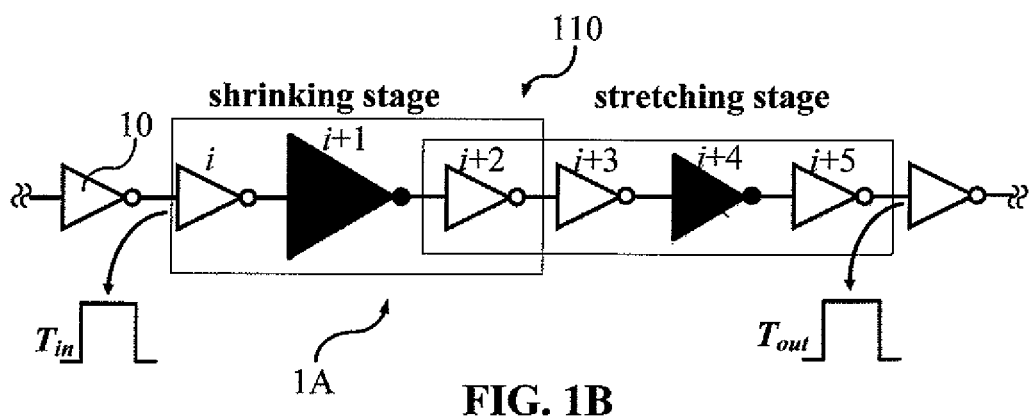
FIG. 1B is a structurally schematic view of a CMOS pulse-mixing device in accordance with a preferred embodiment of the present invention.

FIG. 1B shows a structurally schematic view of the CMOS pulse-mixing device in accordance with a preferred embodiment of the present invention, corresponding to those shown in FIGS. 1 and 1A. Referring now to FIGS. 1, 1A and 1B, the CMOS pulse-mixing device 1A of the preferred embodiment of the present invention provides a mixing function of multiple stages of at least one element set, including two stages, four stages, or other numbers of stages, to control pulse shrinking and stretching together.

With continued reference to FIG. 1B, the CMOS pulse-mixing device 1A includes a plurality of homogeneous logic elements 10 and at least one inhomogeneous logic element set 110. The inhomogeneous logic element set 110 has a pulse shrinking stage (left side) and a pulse stretching stage (right side) for firstly shrinking a pulse signal and further stretching the pulse signal. In an alternative, the inhomogeneous logic element set 110 has a pulse stretching stage (left side) and a pulse shrinking stage (right side) for firstly stretching the pulse signal and further shrinking the pulse signal. Advantageously, the CMOS pulse-mixing device 1A is successfully combining a shrunk pulse and a stretched pulse for mixing the functions of pulse shrinking and stretching.

Figure 2:
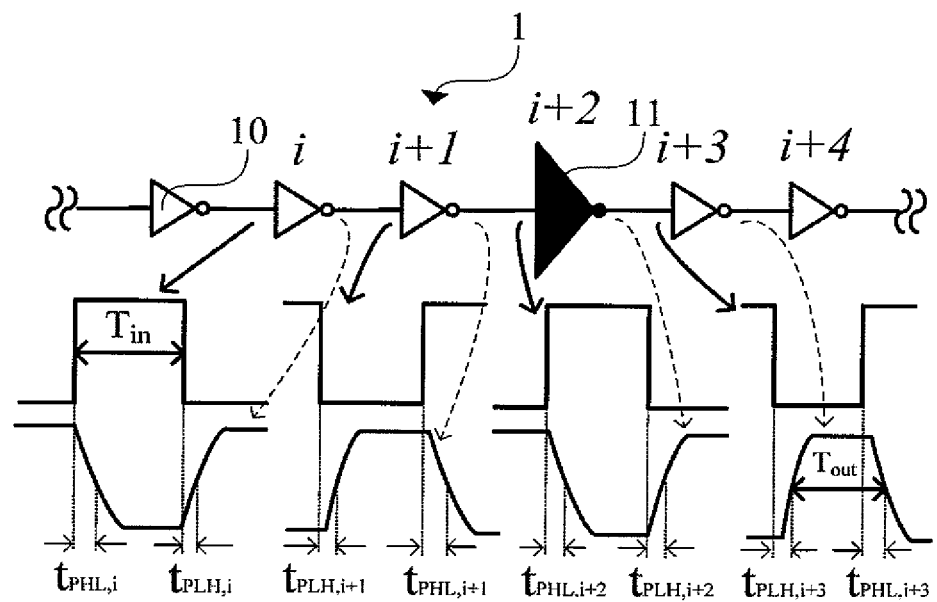
FIG. 2 is a structurally schematic view of the full-customized CMOS single-stage pulse-shrinking or pulse-stretching device in accordance with the preferred embodiment of the present invention with depicting waveforms of pulse signals on associated elements.

FIG. 2 shows a structurally schematic view of the full-customized CMOS pulse-shrinking or pulse-stretching device in accordance with the preferred embodiment of the present invention, as shown in FIG. 1, with depicting waveforms of pulse signals on associated elements. Referring now to FIGS. 1 and 2, the full-customized CMOS pulse-stretching device 1 in accordance with the preferred embodiment of the present invention, input waveforms (solid lines in FIG. 2) and output waveforms (dashed lines in FIG. 2) of the associated homogeneous logic elements 10 and the odd-positioned inhomogeneous logic element 11 during a period from inputting the pulse $T_{in}$ to outputting the output pulse $T_{out}$ are shown for indicating a pulse-stretching mechanism of the present invention.

As shown in FIG. 2, the pulse-shrinking or pulse-stretching mechanism of the full-customized CMOS pulse-stretching device 1 is calculated as:

$$\Delta W = \left(\beta - \frac{1}{\beta}\right) C_i \left(\frac{1}{K_{P,i}} - \frac{1}{K_{N,i}}\right) \phi \quad (1)$$

where $\Delta W$ is a value of pulse shrinking or stretching (i.e. resolution R), $\beta$ is a relative size ratio of transistors, $C_i$ is an input capacitance of i-positioned NOT gate element, $K_{P,i}$ and $K_{N,i}$ are k values of p-type and n-type transistors provided in the i-positioned NOT gate element, and $\phi$ is constant.

Figure 3:
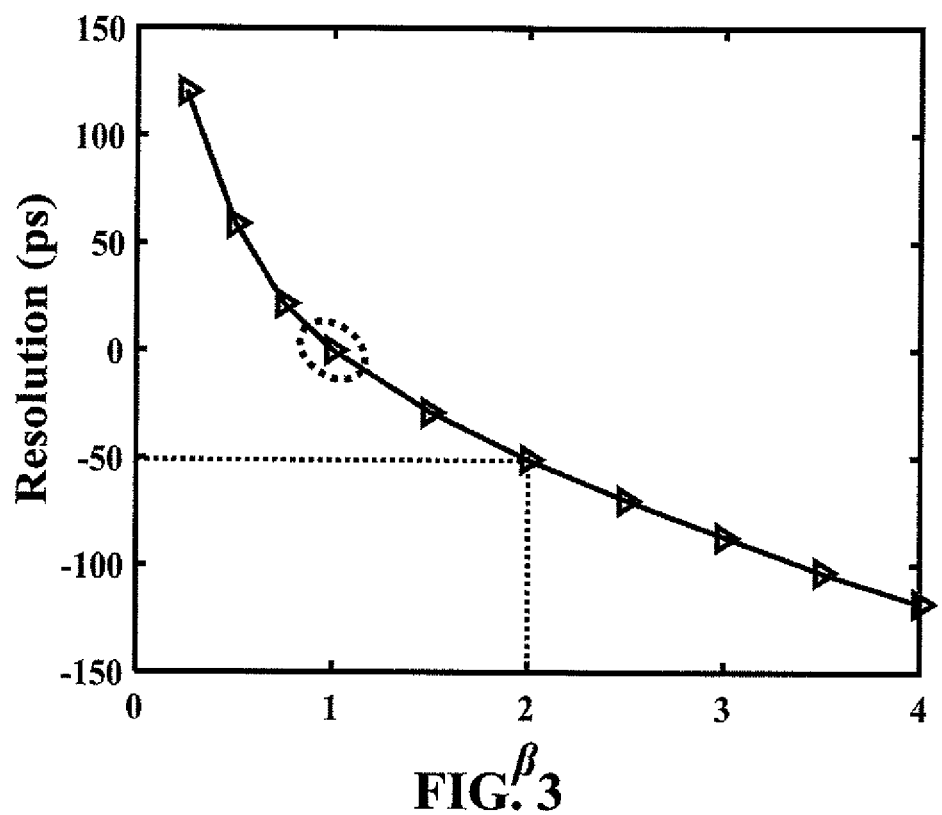
FIG. 3 is a chart of simulated pulse-shrinking or pulse-stretching resolution R in relation to a relative size ratio β of transistors of the full-customized CMOS single-stage pulse-shrinking or pulse-stretching device in accordance with the preferred embodiment of the present invention.

FIG. 3 is a chart of simulated pulse-shrinking or pulse-stretching resolution R in relation to a relative size ratio β of transistors of the full-customized CMOS single-stage pulse-shrinking or pulse-stretching device in accordance with the preferred embodiment of the present invention. Referring now to FIG. 3, the full-customized CMOS pulse-stretching device 1 has a chart of pulse-shrinking or pulse-stretching resolution R in relation to a relative size ration (shown as triangular symbols in FIG. 3). As β equals 1, ΔW becomes zero (i.e. pulse neutralizing). If β is smaller or greater than 1, ΔW becomes pulse shrinking or pulse stretching, as best shown in equation 1. In design, the relative size ratio β must approach 1 to obtain an optimized resolution R, as best shown in dotted ring in FIG. 3.

The CMOS all-digital pulse-mixing method and device thereof in accordance with the present invention can enhance a resolution of pulse-shrinking or pulse-stretching with simplifying a semiconductor-designing process and reducing a semiconductor-designing time. The CMOS all-digital pulse-mixing method and device thereof can further accomplish an optimized resolution of pulse shrinking or pulse stretching even though a low-level CMOS manufacturing process is selected. A double-stage or multi-stage CMOS all-digital pulse-mixing method and device thereof can be implemented by an all digital circuit design which can avoid an full-customized circuit design with a complicated and time-consuming design process. Advantageously, the CMOS all-digital pulse-mixing method and device thereof can be designed by adjusting a quantity "m" of parallel-connected elements. A fine resolution of the all-digital pulse-mixing can be enhanced as the quantity "m" of parallel-connected elements increases. However, the multi-stage CMOS all-digital pulse-mixing method and device thereof can avoid a single-stage pulse-shrinking or pulse-stretching design which results in a coarse resolution in increasing the quantity "m" of elements.

The CMOS all-digital pulse-mixing method and device thereof in accordance with the present invention provides numbers of homogeneous logic elements (e.g. AND gates or NOT gates) having an identical size (e.g. channel length or width) and a quantity of homogeneous logic elements is adjusted to accomplish an all digital structure.

Figure 4:
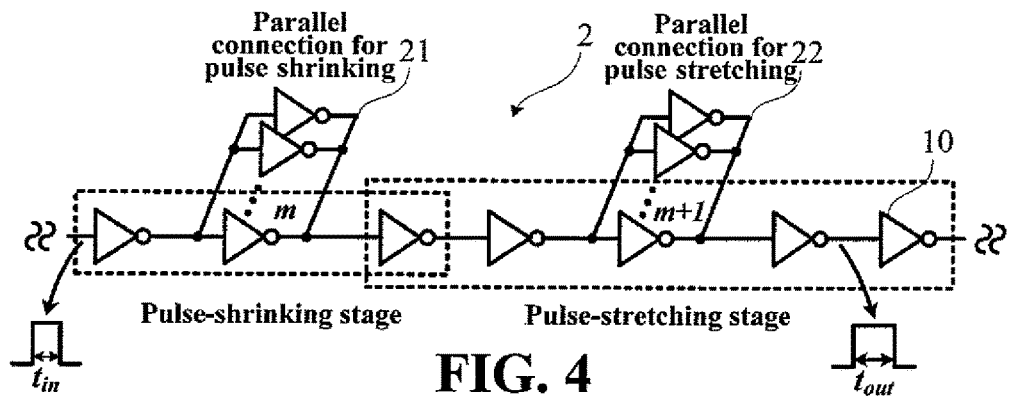
FIG. 4 is a structurally schematic view of a CMOS all-digital pulse-mixing device in accordance with a first preferred embodiment of the present invention.

FIG. 4 shows a structurally schematic view of a CMOS all-digital pulse-mixing device in accordance with a first preferred embodiment of the present invention. Referring now to FIG. 4, the CMOS all-digital pulse-mixing device 2 of the present invention can be formed as a double-stage pulse-mixing device, a four-stage pulse-mixing device or a multi-stage pulse-mixing device.

With continued reference to FIG. 4, the CMOS all-digital pulse-mixing device 2 of the first preferred embodiment of the present invention is a double-stage pulse-mixing device, including a plurality of homogeneous logic elements 10, an even-positioned element parallel connection set 21 and an odd-positioned element parallel connection set 22.

Referring back to FIGS. 1A and 4, prior to forming the CMOS all-digital pulse-mixing device 2 of the first preferred embodiment of the present invention, a basic element sequence 1' is provided. Comparing with the CMOS all-digital pulse-mixing device 2, the basic element sequence 1' only includes a plurality of homogeneous logic elements 10 serially connected, which is accordingly incapable of shrinking or stretching a pulse.

With continued reference to FIGS. 1A and 4, by way of example, the basic element sequence 1' includes a plurality of odd combination positions (i+2, i+4, i+6, i+8) and a plurality of even combination positions (i+1, i+3, i+5, i+7) which are alternatively arranged. The homogeneous logic elements 10, the even-positioned element parallel connection set 21 and the odd-positioned element parallel connection set 22 are suitably arranged at a predetermined even combination positions and a predetermined odd combination positions for serial connection.

Referring again to FIG. 4, the even-positioned element parallel connection set 21 is arranged as a pulse-shrinking end (as shown in the left portion in FIG. 4) and the odd-positioned element parallel connection set 22 is arranged as a pulse-stretching end (as shown in the right portion in FIG. 4) such that a pulse signal can be totally stretched or shrunk by mixing a first degree of pulse shrinking with a second degree of pulse stretching successively. Alternatively, the even-positioned element parallel connection set 21 can be arranged as a pulse-stretching end and the odd-positioned element parallel connection set 22 can be arranged as a pulse-shrinking end such that a pulse signal can be totally stretched or shrunk by mixing a first degree of pulse stretching with a second degree of pulse shrinking successively. As described above, the CMOS all-digital pulse-mixing device 2 can provide a shrunk or stretched pulse with a mixture of pulse shrinking and pulse stretching.

With continued reference to FIG. 4, for example, the even-positioned element parallel connection set 21 serially connects with one of the even combination positions (i+1) while the odd-positioned element parallel connection set 22 serially connects with one of the odd combination positions (i+4). The even-positioned element parallel connection set 21 has a first parallel connection number (m or other integer) of first logic elements while the odd-positioned element parallel connection set 22 has a second parallel connection number (m+1 or other integer) of second logic elements. The parallel connection number "m" is a positive integer.

With continued reference to FIG. 4, in the CMOS all-digital pulse-mixing device 2, a pulse $T_{in}$ is passed through the homogeneous logic elements 10, the even-positioned element parallel connection set 21 and the odd-positioned element parallel connection set 22 in sequence for mixing pulse shrinkage and stretch. After a predetermined delay time, a stretched output pulse $T_{out}$ is output to an end element of the homogeneous logic elements 10. In an alternative, the CMOS all-digital pulse-mixing device 2 can be further designed to stretch the pulse with the even-positioned element parallel connection set 21 and then to shrink the stretched pulse with the odd-positioned element parallel connection set 22 for balancing.

Figure 4A:
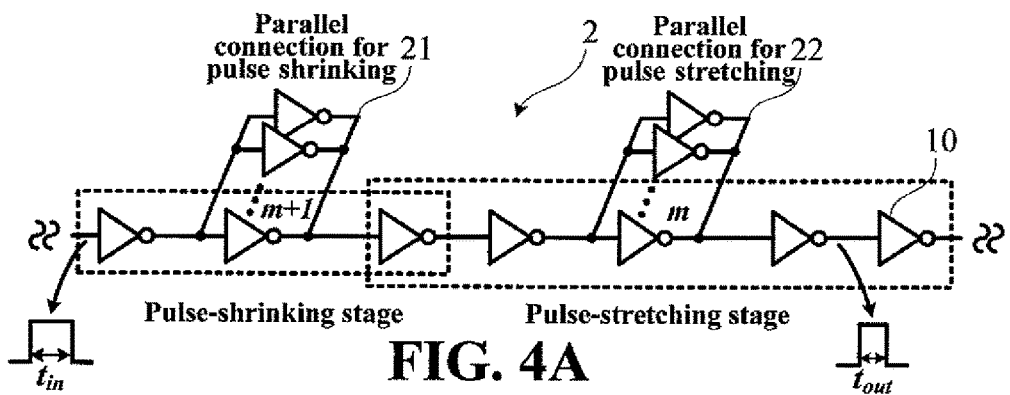
FIG. 4A is a structurally schematic view, similar to FIG. 4, of a CMOS all-digital pulse-mixing device in accordance with another preferred embodiment of the present invention.

FIG. 4A shows a structurally schematic view, similar to FIG. 4, of a CMOS all-digital pulse-mixing device in accordance with another preferred embodiment of the present invention. Turning now to FIG. 4A, the even-positioned element parallel connection set 21 has a first parallel connection number (m+1 or other integer) of first logic elements while the odd-positioned element parallel connection set 22 has a second parallel connection number (m or other integer) of second logic elements. In the CMOS all-digital pulse-mixing device 2, the pulse $T_{in}$ is passed through the homogeneous logic elements 10, the even-positioned element parallel connection set 21 and the odd-positioned element parallel connection set 22 in sequence for mixing pulse stretch and shrinkage. After a predetermined delay time, a shrunk output pulse $T_{out}$ is output to an end element of the homogeneous logic elements 10.

Figure 5:
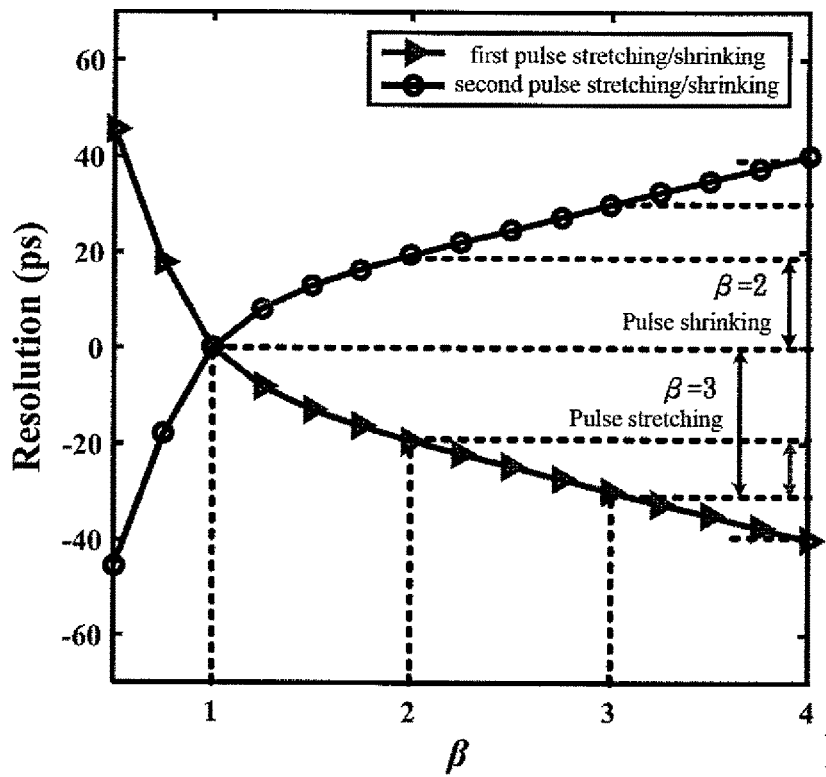
FIG. 5 is a chart of simulated pulse-shrinking or pulse-stretching resolution R in relation to relative size ratio β of parallel-connected homogeneous logic elements (transistors) applied in the CMOS all-digital pulse-mixing device in accordance with the preferred embodiment of the present invention.

FIG. 5 shows a chart of simulated pulse-shrinking or pulse-stretching resolution R in relation to relative size ratio β of parallel-connected homogeneous logic elements (transistors) applied in the CMOS all-digital pulse-mixing device in accordance with the preferred embodiment of the present invention. Turning now to FIG. 5, the pulse-shrinking or pulse-stretching mechanism of the CMOS all-digital pulse-mixing device 2 is calculated as:

$$R = R_m + (-R_{m+1}) = R_m - \qquad (2)$$

$$R_{m+1} = \left[\left(m - \frac{1}{m}\right) - \left(m + 1 - \frac{1}{m+1}\right)\right] \times \eta = -\frac{m(m+1) + 1}{m(m+1)} \times \eta$$

where R is a value of pulse shrinking or pulse stretching, m is a parallel connection number of logic elements, and η is a CMOS process-related parameter of $$C_i\left(\frac{1}{K_{P,i}} - \frac{1}{K_{N,i}}\right)\phi,$$

with the resolution of pulse shrinkage or stretch becoming finer as a value of η varies smaller.

With continued reference to FIG. 5, the CMOS all-digital pulse-mixing device 2 can be designed with a first pulse-stretching or pulse-shrinking mechanism (as indicated with triangular symbols) or a second pulse-stretching or pulse-shrinking mechanism (indicated with circle symbols) according to needs of pulse stretching or pulse shrinking.

Referring back to FIGS. 4 and 5, as β increases from 1 to other integer to define m, a change of resolution between two adjacent points becomes smaller (i.e. distances between horizontal dotted lines in FIG. 5). In an all-digital pulse-mixing design, two degrees of pulse shrinking and pulse stretching can be mixed to enhance a resolution of the CMOS all-digital pulse-mixing device 2.

Figure 5A:
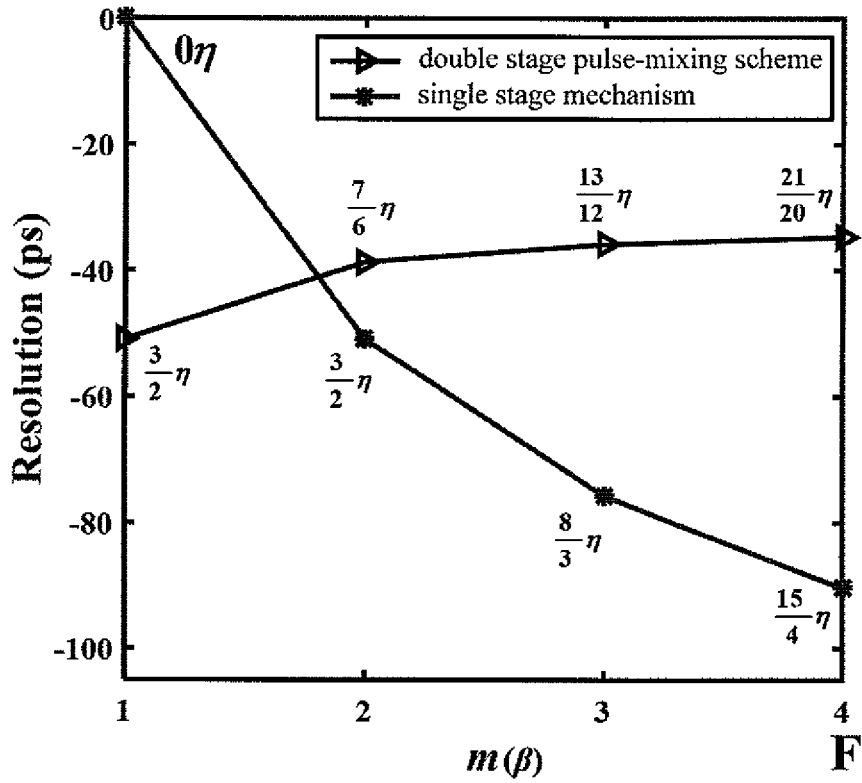
FIG. 5A is a chart of simulated pulse-shrinking or pulse-stretching resolution R in relation to number m (i.e. integer multiple of β) of parallel-connected homogeneous logic elements applied in the CMOS all-digital pulse-mixing device in accordance with the first preferred embodiment of the present invention, comparing with that of the full-customized CMOS single-stage pulse-stretching device.

FIG. 5A shows a chart of simulated pulse-shrinking or pulse-stretching resolution R in relation to number (multiple number) m (i.e. integer multiple of β) of parallel-connected homogeneous logic elements applied in the CMOS all-digital pulse-mixing device in accordance with the first preferred embodiment of the present invention, comparing with that of the full-customized CMOS single-stage pulse-stretching device. Turning now to FIGS. 1 and 5A, the full-customized CMOS pulse-stretching device 1 is a single-stage pulse-stretching device which stretches a pulse with adjusting β from 1 to 4 (i.e. adjusting m from 1 to 4). Suppose the resolution is zero (η=0) if β=1 (i.e. no pulse shrinking or pulse stretching). An optimized resolution is 3/2η if β=2. The resolutions are 8/3η and 15/4η if β=3 and β=4, respectively. Accordingly, the pulse stretching is directly proportional to β along a decreasing curve which accelerates in poor resolution, as shown in the decreasing curve in FIG. 5A.

Turning now to FIGS. 4 and 5A, the CMOS all-digital pulse-mixing device 2 of the first preferred embodiment is an all-digital double-stage pulse-mixing device, with adjusting m from 1 to 4 or other integer. In pulse-mixing operation, the resolutions of the all-digital double-stage pulse-mixing device are 3/2η, 7/6η, 13/12η and 21/20η if m=1, 2, 3, 4. Accordingly, the resolution becomes finer and better and is directly proportional to m along an increasing curve, as shown in the increasing curve in FIG. 5A.

TABLE 1

Resolutions R in relation to multiple number m in accordance with the first embodiment of the present invention

| m | 1 | 2 | 3 | 4 |
|---|---|---|---|---|
| R | 3/2 × η | 7/6 × η | 13/12 × η | 21/20 × η |

Figure 6:
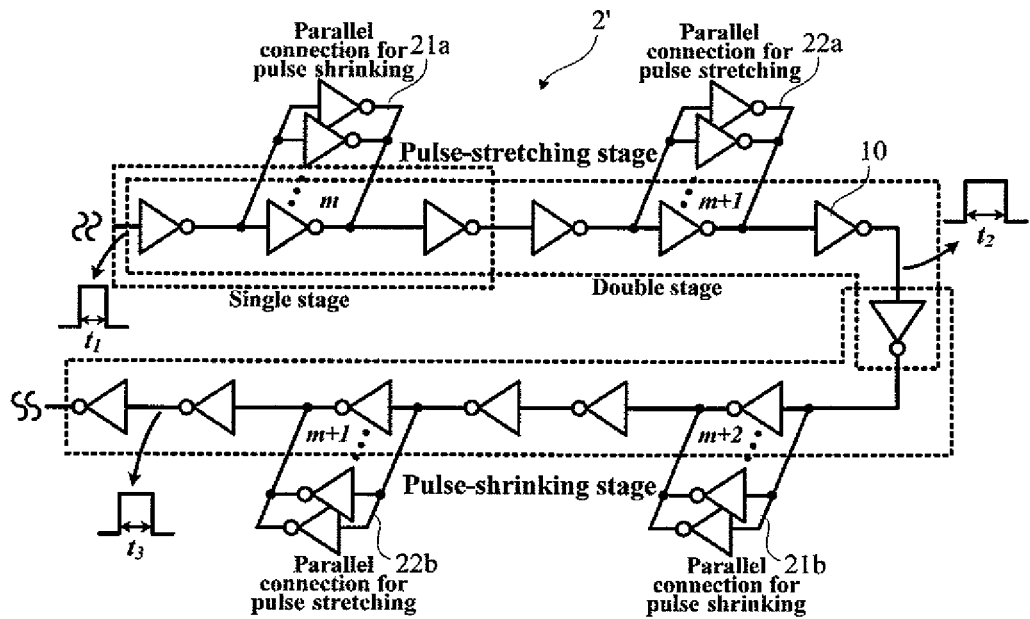
FIG. 6 is a structurally schematic view of a CMOS all-digital pulse-mixing device in accordance with a second preferred embodiment of the present invention.

FIG. 6 shows a structurally schematic view, similar to FIG. 4, of a CMOS all-digital pulse-mixing device in accordance with a second preferred embodiment of the present invention. Referring to FIGS. 4 and 6, in comparison with the first embodiment, the CMOS all-digital pulse-mixing device 2' of the second preferred embodiment is an all-digital four-stage pulse-mixing device, including a plurality of homogeneous logic elements 10, a first even-positioned element parallel connection set 21a (parallel connection number "m"), a first odd-positioned element parallel connection set 22a (parallel connection number "m+1"), a second even-positioned element parallel connection set 21b (parallel connection number "m+2") and a second odd-positioned element parallel connection set 22b (parallel connection number "m+1") for mixing and stretching pulses with four stages.

Figure 6A:
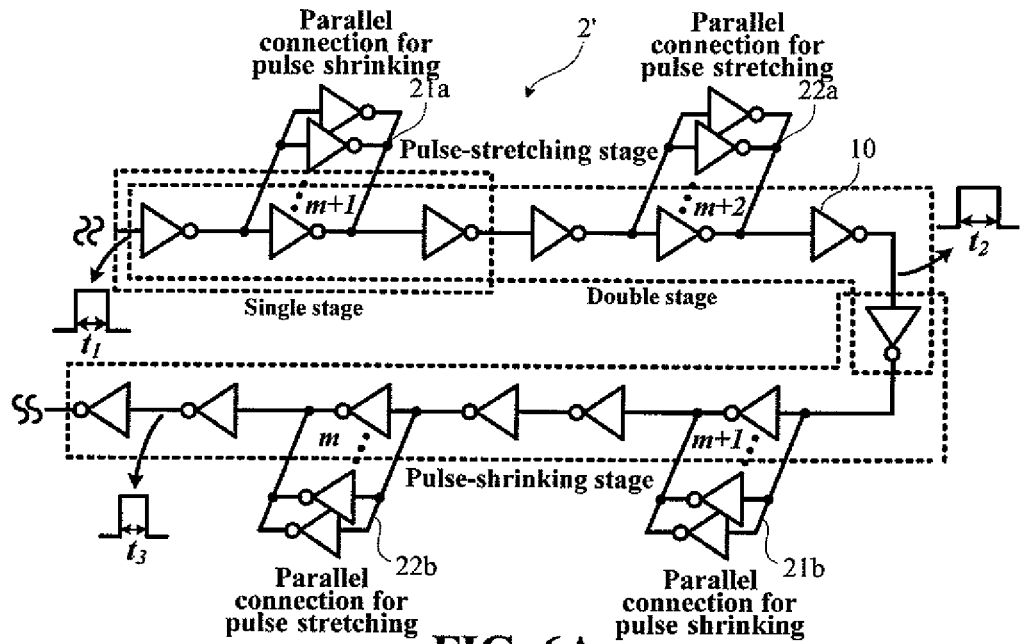
FIG. 6A is a structurally schematic view, similar to FIG. 6, of a CMOS all-digital pulse-mixing device in accordance with another preferred embodiment of the present invention.

FIG. 6A shows a structurally schematic view, similar to FIG. 6, of a CMOS all-digital pulse-mixing device in accordance with another preferred embodiment of the present invention. Referring to FIG. 6A, the CMOS all-digital pulse-mixing device 2' is another all-digital four-stage pulse-mixing device, including a plurality of homogeneous logic elements 10, a first even-positioned element parallel connection set 21a (parallel connection number "m+1"), a first odd-positioned element parallel connection set 22a (parallel connection number "m+2"), a second even-positioned element parallel connection set 21b (parallel connection number "m+1") and a second odd-positioned element parallel connection set 22b (parallel connection number "m") for mixing and shrinking pulses with four stages.

Referring back to FIG. 6, the first even-positioned element parallel connection set 21a and the first odd-positioned element parallel connection set 22a are combined to form a first pulse-mixing and stretching set which is a double-stage pulse-stretching mechanism (S(m)<E(m+1)) calculated as:

$$R_E = R_m + (-R_{m+1}) = R_m - R_{m+1} = -\frac{m(m+1)+1}{m(m+1)} \times \eta. \quad (3)$$

With continued reference to FIG. 6, the second even-positioned element parallel connection set 21b and the second odd-positioned element parallel connection set 22a are combined to form a second pulse-mixing and stretching set which is a double-stage pulse-shrinking mechanism (E(m+1)<S(m+2)) calculated as:

$$R_S = R_{m+2} + (-R_{m+1}) = R_{m+2} - R_{m+1} = \frac{(m+1)(m+2)+1}{(m+1)(m+2)} \times \eta. \quad (4)$$

The pulse-stretching and shrinking mixed mechanism is calculated as:

$$R = R_E + R_S = -\frac{2}{m(m+1)(m+2)} \times \eta. \quad (5)$$

Figure 7:
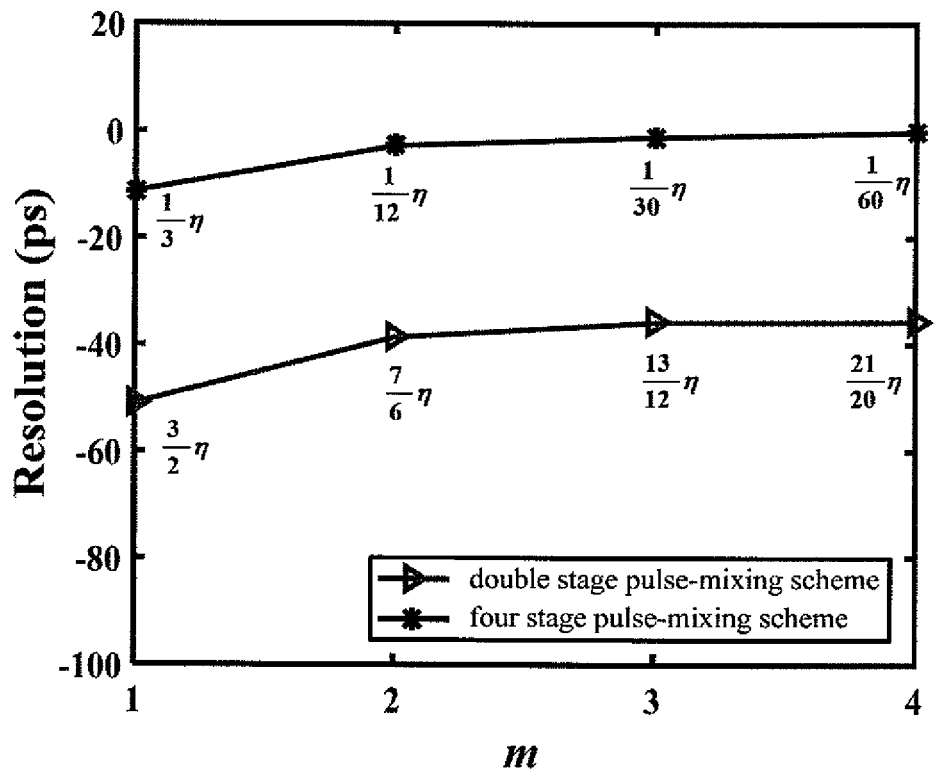
FIG. 7 is a chart of simulated pulse-shrinking or pulse-stretching resolution R in relation to number m of parallel-connected homogeneous logic elements of the CMOS all-digital pulse-mixing devices in accordance with the preferred embodiment of the present invention.

FIG. 7 shows a chart of simulated pulse-shrinking or pulse-stretching resolution R in relation to number m of parallel-connected homogeneous logic elements applied in two CMOS all-digital pulse-mixing devices in accordance with the preferred embodiment of the present invention.

Referring now to FIGS. 6 and 7, the resolutions of the CMOS all-digital pulse-mixing device 2 with double-stage pulse mixing are 3/2η, 7/6η, 13/12η and 21/20η if m=1, 2, 3, 4, as shown in the lower curve in FIG. 7.

TABLE 2

Resolutions R in relation to multiple number m in accordance with the second embodiment of the present invention.

| m | 1 | 2 | 3 | 4 |
|---|---|---|---|---|
| R | 1/3 × η | 1/12 × η | 1/30 × η | 1/60 × η |

Referring again to FIGS. 6A and 7, the resolutions of the CMOS all-digital pulse-mixing device 2' with four-stage pulse mixing are 1/3η, 1/12η, 1/30η and 1/60η if m=1, 2, 3, 4, as shown in the upper curve in FIG. 7. In comparison with the double-stage pulse-mixing device, the CMOS all-digital pulse-mixing device 2' with double-stage pulse-mixing can generate an optimized resolution without using a high-level CMOS manufacturing process. As to multi-stage pulse-mixing, a further finer resolution of the multi-stage pulse-mixing device can be calculated with equations (3), (4) and (5).

Figure 8:
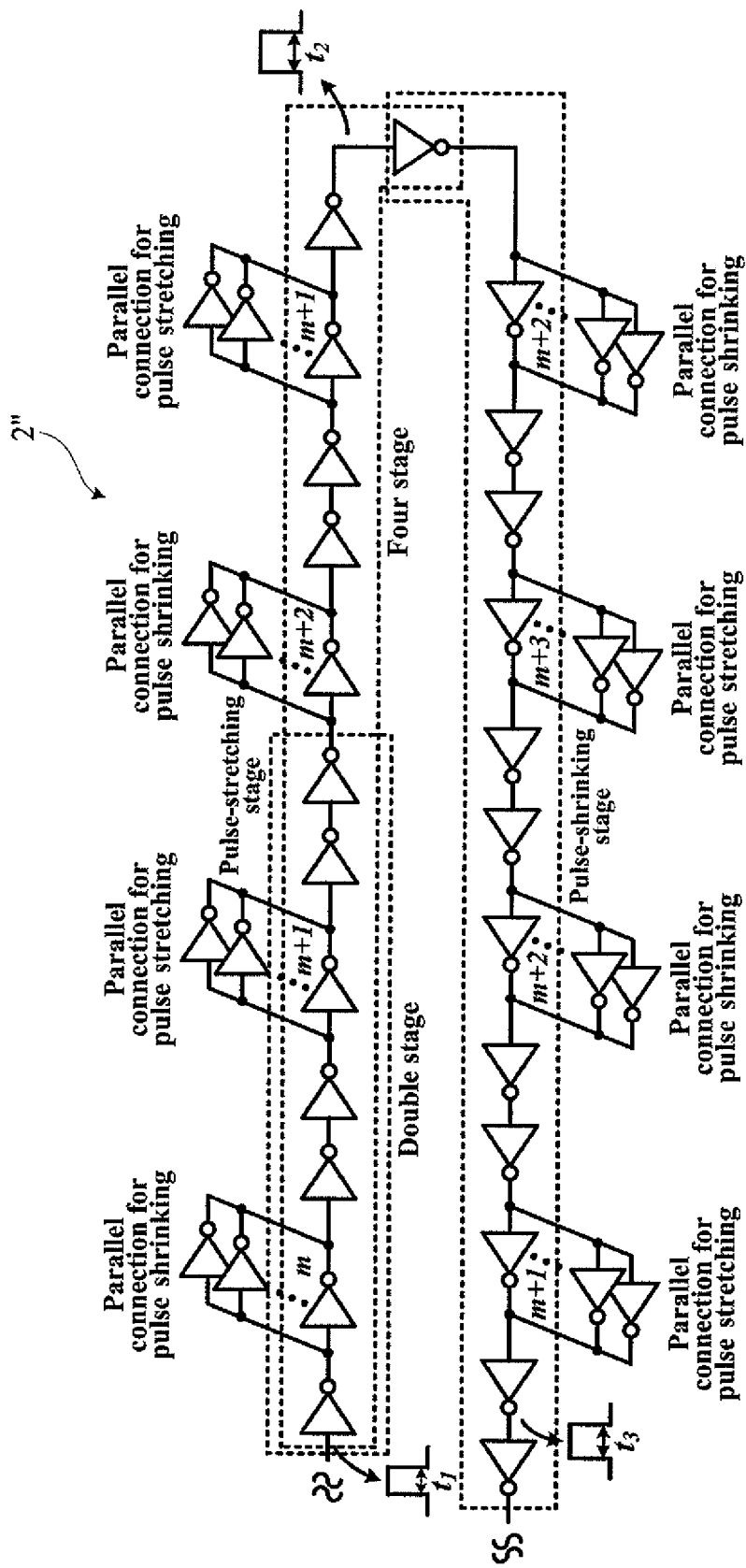
FIG. 8 is a structurally schematic view of a CMOS all-digital pulse-mixing device in accordance with a third preferred embodiment of the present invention.

FIG. 8 shows a structurally schematic view of a CMOS all-digital pulse-mixing device in accordance with a third preferred embodiment of the present invention. Referring to FIGS. 4, 6 and 8, in comparison with the first and second embodiments, the CMOS all-digital pulse-mixing device 2" of the third preferred embodiment is an all-digital eight-stage pulse-mixing device. The eight-stage pulse-mixing mechanism of the CMOS all-digital pulse-mixing device 2" is calculated as:

$$R = -\frac{6}{m(m+1)(m+2)(m+3)} \times \eta. \quad (6)$$

Although the invention has been described in detail with reference to its presently preferred embodiment, it will be understood by one of ordinary skill in the art that various modifications can be made without departing from the spirit and the scope of the invention, as set forth in the appended claims.

What is claimed is:

1. A CMOS all-digital pulse-mixing method comprising:
providing a plurality of odd combination positions and a plurality of even combination positions on a basic element sequence which is formed from a series of basic elements;
providing a plurality of homogeneous logic elements, at least one first element parallel connection set and at least one second element parallel connection set for forming an all-digital pulse-mixing device;
arranging the at least one first element parallel connection set as an odd-positioned element parallel connection set, with the at least one first element parallel connection set having a first parallel connection number of first logic elements;
arranging the at least one second element parallel connection set as an even-positioned element parallel connection set, with the at least one second element parallel connection set having a second parallel connection number of second logic elements;
serially connecting the at least one first element parallel connection set with a first predetermined position of the plurality of odd combination positions and serially connecting the at least one second element parallel connection set with a second predetermined position of the plurality of even combination positions; and utilizing the at least one first element parallel connection set and the at least one second element parallel connection set to stretch or shrink a pulse signal, with mixing a first degree of pulse stretching and a second degree of pulse shrinking to generate a stretched pulse signal or a shrunk pulse signal.

2. The method as defined in claim 1, wherein the first parallel connection number of first logic elements and the second parallel connection number of second logic elements are different or identical.

3. The method as defined in claim 1, wherein the at least one first element parallel connection set and the at least one second element parallel connection set define a double-stage pulse-mixing device.

4. The method as defined in claim 1, wherein the homogeneous logic element is a logic gate, a NOT gate element or an AND gate element.

5. The method as defined in claim 1, wherein the odd combination position of the basic element sequence includes a start combination position which is a third combination position.

6. The method as defined in claim 1, wherein the first logic elements and the second logic elements are homogeneous logic elements.

7. A CMOS all-digital pulse-mixing device comprising:
a basic element sequence including a plurality of odd combination positions and a plurality of even combination positions;
a plurality of homogeneous logic elements connected to form the basic element sequence;
at least one first element parallel connection set formed as an odd-positioned element parallel connection set, with the at least one first element parallel connection set having a first parallel connection number of first logic elements, with serially connecting the at least one first element parallel connection set with a first predetermined position of the plurality of odd combination positions; and
at least one second element parallel connection set formed as an even-positioned element parallel connection set, with the at least one second element parallel connection set having a second parallel connection number of second logic elements, with serially connecting the at least one second element parallel connection set with a second predetermined position of the plurality of even combination positions;
wherein the at least one first element parallel connection set and the at least one second element parallel connection set are utilized to stretch or shrink a pulse signal, with mixing a first degree of pulse stretching and a second degree of pulse shrinking to generate a stretched pulse signal or a shrunk pulse signal.

8. The device as defined in claim 7, wherein the first parallel connection number of first logic elements and the second parallel connection number of second logic elements are different or identical.

9. The device as defined in claim 7, wherein the at least one first element parallel connection set and the at least one second element parallel connection set define a double-stage pulse-mixing device.

10. The device as defined in claim 7, wherein the homogeneous logic element is a logic gate, a NOT gate element or an AND gate element.

11. The device as defined in claim 7, wherein the odd combination position of the basic element sequence includes a start combination position which is a third combination position.

12. The device as defined in claim 7, wherein the first logic elements and the second logic elements are homogeneous logic elements.

13. A CMOS all-digital pulse-mixing device comprising:
a basic element sequence including a plurality of odd combination positions and a plurality of even combination positions;
a plurality of homogeneous logic elements connected to form the basic element sequence;
a first element parallel connection set formed as an odd-positioned element parallel connection set, with the first element parallel connection set having a first parallel connection number of first logic elements, with serially connecting the first element parallel connection set with a first predetermined position of the plurality of odd combination positions;
a second element parallel connection set formed as an even-positioned element parallel connection set, with the second element parallel connection set having a second parallel connection number of second logic elements, with serially connecting the second element parallel connection set with a second predetermined position of the plurality of even combination positions;
a third element parallel connection set formed as an odd-positioned element parallel connection set or an even-positioned element parallel connection set, with the third element parallel connection set having a third parallel connection number of third logic elements, with serially connecting the third element parallel connection set with a third predetermined position of the a plurality of odd combination positions and the a plurality of even combination positions; and
a fourth element parallel connection set formed as an even-positioned element parallel connection set or an odd-positioned element parallel connection set, with the fourth element parallel connection set having a fourth parallel connection number of fourth logic elements, with serially connecting the fourth element parallel connection set with a fourth predetermined position of the a plurality of even combination positions and the a plurality of odd combination positions;
wherein the first element parallel connection set and the second element parallel connection set are utilized to stretch or shrink a pulse signal, with mixing a first degree of pulse stretching and a second degree of pulse shrinking to generate a first-stage stretched pulse signal or a first-stage shrunk pulse signal; and
wherein the third element parallel connection set and the fourth element parallel connection set are further utilized to stretch or shrink the pulse signal, with mixing a third degree of pulse stretching or pulse shrinking and a fourth degree of pulse shrinking or pulse stretching to generate a second-stage stretched pulse signal or a second-stage shrunk pulse signal.

14. The device as defined in claim 13, wherein the first parallel connection number of first logic elements and the second parallel connection number of second logic elements are different or identical.

15. The device as defined in claim 13, wherein the third parallel connection number of third logic elements and the fourth parallel connection number of fourth logic elements are different or identical.

16. The device as defined in claim 13, wherein the first element parallel connection set, the second element parallel connection set, the third element parallel connection set and the fourth element parallel connection set define a multi-stage pulse-mixing device.

17. The device as defined in claim 13, wherein the homogeneous logic element is a logic gate, a NOT gate element or an AND gate element.

18. The device as defined in claim 13, wherein the odd combination position of the basic element sequence includes a start combination position which is a third combination position.

19. The device as defined in claim 13, wherein the first logic elements and the second logic elements are homogeneous logic elements.

20. The device as defined in claim 13, wherein the third logic elements and the fourth logic elements are homogeneous logic elements.

\* \* \* \* \*